United States Patent
He et al.

(10) Patent No.: US 11,929,185 B2
(45) Date of Patent: Mar. 12, 2024

(54) DYNAMIC ISOTOPE BATTERY

(71) Applicant: SOUTH UNIVERSITY OF SCIENCE AND TECHNOLOGY OF CHINA, Guangdong (CN)

(72) Inventors: Jiaqing He, Guangdong (CN); Yi Zhou, Guangdong (CN); Dongsheng He, Guangdong (CN); Yi Huang, Guangdong (CN)

(73) Assignee: SOUTH UNIVERSITY OF SCIENCE AND TECHNOLOGY OF CHINA, Shenzhen (CN)

( * ) Notice: Subject to any disclaimer, the term of this patent is extended or adjusted under 35 U.S.C. 154(b) by 1143 days.

(21) Appl. No.: 16/694,392

(22) Filed: Nov. 25, 2019

(65) Prior Publication Data
US 2020/0090825 A1   Mar. 19, 2020

Related U.S. Application Data

(63) Continuation of application No. PCT/CN2018/086916, filed on May 15, 2018.

(51) Int. Cl.
| | |
|---|---|
| *G21H 1/10* | (2006.01) |
| *G21H 1/00* | (2006.01) |
| *H10N 30/85* | (2023.01) |
| *H10N 30/853* | (2023.01) |

(52) U.S. Cl.
CPC ........... *G21H 1/103* (2013.01); *G21H 1/00* (2013.01); *H10N 30/85* (2023.02); *H10N 30/853* (2023.02)

(58) Field of Classification Search
CPC ................. G21H 1/103; G21H 1/00
See application file for complete search history.

(56) References Cited

FOREIGN PATENT DOCUMENTS

| CN | 105427913 A | * | 3/2016 | |
|---|---|---|---|---|
| CN | 105575453 | | 5/2016 | |
| CN | 105575453 A | * | 5/2016 | |
| CN | 107605557 | | 1/2018 | |
| CN | 108550412 A | * | 9/2018 | ............ G21H 1/00 |

OTHER PUBLICATIONS

English machine translation of CN 108550412 A (Year: 2023).*
English machine translation of CN 105575453 A (Year: 2023).*
English machine translation of CN 105427913 A (Year: 2023).*
CNIPO, Office Action for CN Application No. 201810462756.6, dated Feb. 27, 2020.

* cited by examiner

*Primary Examiner* — Angelo Trivisonno
(74) *Attorney, Agent, or Firm* — Hodgson Russ LLP

(57) ABSTRACT

A dynamic isotope battery includes: a metallic canal; a housing, defining a chamber for accommodating a heat source and provided with a non-return valve, two opposite ends of the housing being communicated with two ends of the metallic canal respectively to form a closed circulation loop; a fuel cartridge fixedly disposed within the housing; a radioactive source contained in the fuel cartridge; a liquid metal provided in the circulation loop; a piezoelectric transduction component disposed on an inner surface of the metallic canal; a heat dissipation structure, provided at an outer surface of the metallic canal and spaced apart from the piezoelectric transduction component along an axial direction of the metallic canal; and an electromagnetic pump, provided at the metallic canal for driving circular flow of the liquid metal.

20 Claims, 5 Drawing Sheets

DYNAMIC ISOTOPE BATTERY

CROSS-REFERENCE TO RELATED APPLICATION

This application is a continuation of International Application No. PCT/CN2018/086916, filed May 15, 2018, the entire disclosure of which is incorporated herein by reference.

FIELD

The present disclosure relates to fields of liquid metals and isotope batteries, and more particularly to a dynamic isotope battery based on a liquid metal.

BACKGROUND

A radioactive isotope is a kind of isotope whose atomic nucleus changes spontaneously in composition (or energy state) with accompanied by ray radiation. A radioactive dynamic isotope battery, also known as a dynamic isotope battery for short, can convert energies released from radioisotope decay into electric energies using a transducer component and output the electric energies so as to achieve power supply purpose. The isotope battery has been widely used in military and national defense, deep-space, deep-sea and polar explorations, biomedical and electronic industries because of its long lifetime, strong environmental adaptability, good working stability, maintenance-free, miniaturization and the like. However, the existing isotope battery needs to be further improved.

SUMMARY

Embodiments of the present disclosure seek to solve at least one of the problems existing in the related art to at least some extent. For this, an objective of the present application is to provide a dynamic isotope battery which can break through technical bottlenecks of single energy conversion, poor reliability and large energy loss present in traditional dynamic isotope batteries and has characteristics of high energy conversion efficiency, good working stability or adjustable output power.

In an aspect, embodiments of the present application provide a dynamic isotope battery, including: a metallic canal; a housing, defining a chamber for accommodating a heat source and provided with a non-return valve, two opposite ends of the housing being communicated with two ends of the metallic canal respectively to form a closed circulation loop; a fuel cartridge fixedly disposed within the housing; a radioactive source contained in the fuel cartridge; a liquid metal provided in the circulation loop; a piezoelectric transduction component disposed on an inner surface of the metallic canal; a heat dissipation structure, provided at an outer surface of the metallic canal and spaced apart from the piezoelectric transduction component along an axial direction of the metallic canal; and an electromagnetic pump, provided at the metallic canal for driving circular flow of the liquid metal.

In some embodiments of the present disclosure, the fuel cartridge has a first opening at an upper surface thereof, the housing has a second opening corresponding to the first opening, the first opening and the second opening are sealed by a gasket, and a first end of the radioactive source is disposed at the gasket.

In some embodiments of the present disclosure, the gasket is provided with a fixing element, by which the radioactive source is fixed at the gasket.

In some embodiments of the present disclosure, the fuel cartridge, the gasket, and the fixing element each are made of a material selected from one or more of a tantalum-base alloy, a zirconium-base alloy and an iridium-base alloy.

In some embodiments of the present disclosure, the dynamic isotope battery further includes: a first fixing bracket, disposed between a lower surface of the fuel cartridge and the inner surface of the housing; and a second fixing bracket, disposed between the upper surface of the fuel cartridge and the inner surface of the housing, and provided with a third opening corresponding to the first and second openings. The fuel cartridge is clamped between the first fixing bracket and the second fixing bracket, and the third opening is sealed by the gasket.

In some embodiments of the present disclosure, the housing, the metallic canal, the first fixing bracket and the second fixing bracket each are made of a material selected from one or more of 316 stainless steel, 304 stainless steel and 310 stainless steel.

In some embodiments of the present disclosure, the dynamic isotope battery further includes a nano lead plexiglass composite coating coated on the inner surface of the housing.

In some embodiments of the present disclosure, the radioactive source is at least one selected from an $\alpha$ radioactive source, a $\beta$ radioactive source, a related spent nuclear fuel, a small modular nuclear heat source and a small modular reactor.

In some embodiments of the present disclosure, the $\alpha$ radioactive source is at least one selected from $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$_3^{210}$Po, Y$_3^{210}$Po, La$_3^{210}$Po, Ce$_3^{210}$Po, Pr$_3^{210}$Po, Nd$_3^{210}$Po, Sm$_3^{210}$Po, Eu$_3^{210}$Po, Th$_3^{210}$Po, Dy$_3^{210}$Po, Ho$_3^{210}$Po, Er$_3^{210}$Po, Tm$_3^{210}$Po, Yb$_3^{210}$Po, Lu$_3^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel sphere, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$; and the $\beta$ radioactive source is at least one selected from (C$_4$H$_3^3$H$_5$—)$_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{99}$Tc, $^{106}$Rn, $^{137}$Cs, $^{137}$CsCl, $^{144}$Ce, $^{144}$CeO$_2$, $^{147}$Pm, $^{147}$Pm$_2$O$_3$, $^{151}$Sm and $^{226}$Ra.

In some embodiments of the present disclosure, the liquid metal is at least one selected from a liquid Ga metal, a liquid GaSn alloy, a liquid GaIn alloy, a liquid GaZn alloy, a liquid GaInSn alloy, a liquid GaInZn alloy, a liquid GaInSnZn alloy, a liquid BiInSn alloy and a liquid BiInSnGa alloy.

In some embodiments of the present disclosure, the piezoelectric transduction component is a single-side fixed piezoelectric transduction component or a double-side fixed piezoelectric transduction component, and the piezoelectric transduction component is made of a material selected from one or more of lead titanate, lead zirconate titanate, lead magnesium niobate, lead zinc niobate, lead scandium tantalate, barium titanate, sodium bismuth titanate, polyvinylidene fluoride and perovskite piezoelectric materials.

In some embodiments of the present disclosure, the heat dissipation structure is made of a material selected from one or more of graphite, copper and an aluminum-base alloy In some embodiments of the present disclosure, the dynamic isotope battery further includes a thermoelectric transduction component disposed between the outer surface of the metallic canal and the heat dissipation structure.

In some embodiments of the present disclosure, the thermoelectric transduction component includes: a first insulative and heat conductive substrate; a second insulative and heat conductive substrate, opposite to the first insulative and heat conductive substrate and disposed on the outer surface of the metallic canal; and a plurality of thermoelectric groups distributed in a circumferential direction of the metallic canal and spaced apart each other. Each thermoelectric group extends along the axial direction of the metallic canal and includes a plurality of p-type thermoelectric legs and a plurality of n-type thermoelectric legs that are alternately arranged and electrically connected in sequence. Each thermoelectric group has one first-end thermoelectric leg and one second-end thermoelectric leg, and two end thermoelectric legs of two adjacent thermoelectric groups at the same end are in different types. The first-end thermoelectric leg of a thermoelectric group is electrically connected to the first-end thermoelectric leg of one of two thermoelectric groups both adjacent to said thermoelectric group, and the second-end thermoelectric leg of said thermoelectric group is electrically connected to the second-end thermoelectric leg of the other one of two thermoelectric groups both adjacent to said thermoelectric group.

In some embodiments of the present disclosure, the thermoelectric transduction component includes: a first insulative and heat conductive substrate; a second insulative and heat conductive substrate, opposite to the first insulative and heat conductive substrate and disposed on the outer surface of the metallic canal; and a plurality of thermoelectric groups distributed in a circumferential direction of the metallic canal and spaced apart each other. Each thermoelectric group extends along the axial direction of the metallic canal and includes a plurality of p-type thermoelectric legs and a plurality of n-type thermoelectric legs that are alternately arranged and electrically connected in sequence. Each thermoelectric group has one first-end thermoelectric leg and one second-end thermoelectric leg, and two end thermoelectric legs of two adjacent thermoelectric groups at the same end are in different types. For each thermoelectric group, the first-end thermoelectric leg of the thermoelectric group is electrically connected to the first-end thermoelectric leg of a thermoelectric group, if present, previous to the thermoelectric group, and the second-end thermoelectric leg of the thermoelectric group is electrically connected to the second-end thermoelectric leg of a thermoelectric group, if present, next to the thermoelectric group.

In some embodiments of the present disclosure, the thermoelectric transduction component further includes: a plurality of first electrodes disposed between the thermoelectric group and the first insulative and heat conductive substrate; and a plurality of second electrodes disposed between the thermoelectric group and the second insulative and heat conductive substrate. One p-type thermoelectric leg and one n-type thermoelectric leg adjacent to and electrically connected with the one p-type thermoelectric leg constitute a thermoelectric pair, the p-type thermoelectric leg and the n-type thermoelectric leg in each thermoelectric pair are electrically connected via the first electrode, and the p-type thermoelectric leg in one of two adjacent thermoelectric pairs and the n-type thermoelectric leg in the other of the two adjacent thermoelectric pairs are electrically connected via the second electrode.

In some embodiments of the present disclosure, the thermoelectric transduction component further includes: a plurality of first electrodes disposed between the thermoelectric group and the first insulative and heat conductive substrate; and a plurality of second electrodes disposed between the thermoelectric group and the second insulative and heat conductive substrate, and each thermoelectric leg has a first end and a second end. The first end of an n-type thermoelectric leg is electrically connected to the first end of one of two p-type thermoelectric legs both adjacent to said n-type thermoelectric leg through the first electrode, and the second end of said n-type thermoelectric leg is electrically connected to the second end of the other one of two p-type thermoelectric legs both adjacent to said n-type thermoelectric leg through the second electrode.

In some embodiments of the present disclosure, the p-type thermoelectric leg is made of a material selected from one or more of p-type $Bi_2Te_3$-based material, p-type $Sb_2Se_3$-based material, p-type $Sb_2Te_3$-based material, p-type PbTe-based material, p-type $CoSb_3$-based material, p-type half-Heusler material, p-type $Cu_{1.8}S$-based material and p-type $AgSbTe_2$-based material; and the n-type thermoelectric leg is made of a material selected from one or more of n-type $Bi_2Te_3$-based material, n-type BiSb-based material, n-type $Zn_4Sb_3$-based material, n-type $Mg_3Sb_2$-based material, n-type $Bi_2Se_3$-based material, n-type $Sb_2Se_3$-based material, n-type PbTe-based material, n-type PbS-based material, n-type $CoSb_3$-based material, n-type $Mg_2Si$-based material, n-type $Zn_4Sb_3$-based material, n-type InSb-based material, n-type half-Heusler material, n-type oxide material and n-type $AgSbTe_2$-based material.

In some embodiments of the present disclosure, the piezoelectric transduction component is provided with a first piezoelectric output electrode and a second piezoelectric output electrode, the thermoelectric transduction component is provided with a first thermoelectric output electrode and a second thermoelectric output electrode, and the first piezoelectric output electrode, the second piezoelectric output electrode, the first thermoelectric output electrode and the second thermoelectric output electrode each are made of one or more of Au, Pd, Pt, Al, Cu, Ni and Ti.

In some embodiments of the present disclosure, the electromagnetic pump is a cylindrical pump.

DETAILED DESCRIPTION

Figure 1:
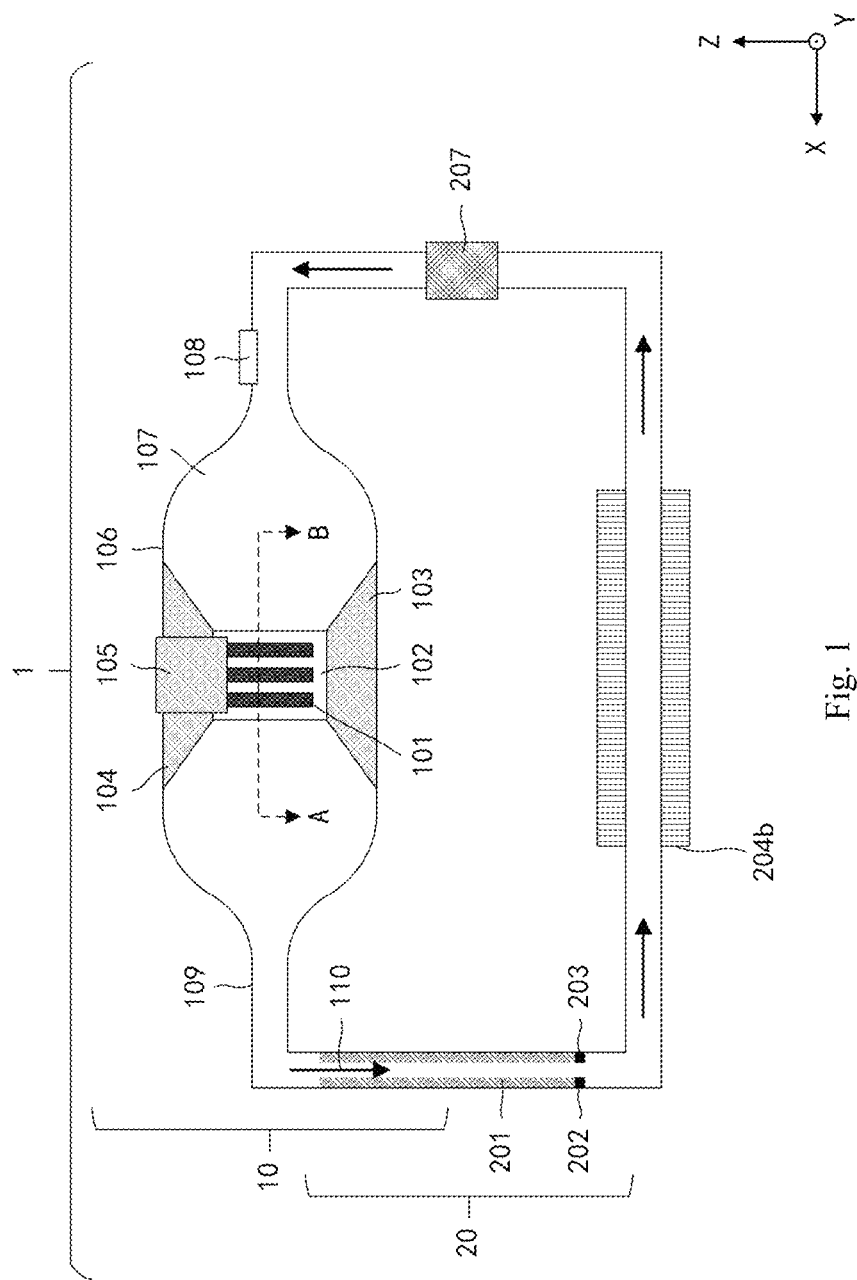
FIG. 1 is a schematic diagram of a dynamic isotope battery according to an embodiment of the present application.

In the following, embodiments of the present disclosure will be described in detail. The embodiments described below are explanatory, illustrative, and used to generally understand the present disclosure, and shall not be construed to limit the present disclosure. Embodiments not indicating specific techniques or conditions are carried out in accordance with those described in literatures in the related art or in accordance with product specifications. Reagents or instruments not indicating their manufacturers are conventional products commercially available.

An isotope battery was firstly proposed by British physicist Henry Moseley in 1913, while the dynamic isotope battery was researched mainly in the past 100 years. In 2017, Yi Zhou et al. classified the isotope batteries, according to energy conversion efficiencies and output powers under different energy conversion modes, into four types including: 1) static thermoelectric isotope battery (such as thermoelectric, thermionic emission, contact potential difference, thermo photovoltaic, and alkali metal thermal to electric conversion (AMTEC) isotope batteries); 2) radiation voltaic isotope battery (RVIB) (such as Schottky and PN/PIN junction isotope batteries); 3) dynamic thermoelectric type isotope battery (such as Brayton cycle, Stirling cycle, Rankine cycle, magnetohydrodynamic power generation, and jet driven piezoelectric isotope batteries); and 4) special energy conversion mechanism-based isotope battery (such as direct charge, radioluminescence, decay LC circuit coupling resonance, piezoelectric cantilever, isotope battery driven by external neutron source, cosmic ray/electromagnetic wave collection, magnetic constrained beta particle electromagnetic radiation, magnetic separation, and radiation ionization isotope batteries).

Research results of the above four types of isotope batteries show that low energy conversion efficiencies are still the common challenge of the current isotope batteries. For example, even though the static thermoelectric type isotope battery has achieved a certain development owning to the large support at the national level, especially the design and manufacture of a radioisotope thermoelectric generator (RTG) have been gradually improved in the United States, but their energy conversion efficiencies are still low as their energy conversions are based on thermoelectric materials, even the enhanced multi-mission radioisotope thermoelectric generator (eMMRTG) newly reported by NASA only has an energy conversion efficiency of less than 8%, so their application ranges are limited and difficult to expand to civilian use. The radiation voltaic isotope battery with an energy conversion component made of semiconductor materials may realize the miniaturization of isotope battery devices, improve its application in Micro-Electro Mechanical System (MEMS)/Nano-Electromechanical System (NEMS) and low power/ultralow power electronic devices, and has acquired achievements to some extent with the rapid development of wide-bandgap semiconductor and multidimensional ordered structural materials. However, performances of the semiconductor materials will degenerate under long-term radiation, which results in the reduction of the lifetime of the radiation voltaic isotope battery. Compared with the static thermoelectric type isotope battery and the radiation voltaic isotope battery, the dynamic thermoelectric isotope battery has higher energy conversion efficiency and has become an important research direction of the isotope batteries. However, traditional dynamic isotope batteries generate electricity using turbines or heat engines, and fail to be practical applied due to some technical bottlenecks, such as it is difficult to lubricate a high-speed running part, and an inertia vector caused by high-speed rotation affects the system stability. Therefore, the dynamic isotope battery needs to be further studied.

Embodiments of the present disclosure seek to solve at least one of the problems existing in the related art to at least some extent.

In embodiments of the present disclosure, a dynamic isotope battery is provided. As illustrated in FIG. 1, the dynamic isotope battery 1 includes: a metallic canal 109; a housing 106, defining a chamber 107 for accommodating a heat source and provided with a non-return valve 108, two opposite ends of the housing 106 being communicated with two ends of the metallic canal 109 respectively to form a closed circulation loop; a fuel cartridge 102 fixedly disposed within the housing 106; a radioactive source 101 contained in the fuel cartridge 102; a liquid metal 110 (whose flow direction is indicated by arrows in figures) provided in the circulation loop; a piezoelectric transduction component 201 disposed on an inner surface of the metallic canal 109; a heat dissipation structure 204b, provided at an outer surface of the metallic canal 109 and spaced apart from the piezoelectric transduction component 201 along an axial direction of the metallic canal 109; and an electromagnetic pump 207, provided at the metallic canal 109 for driving circular flow of the liquid metal 110. Therefore, the dynamic isotope battery according to embodiments of the present disclosure breaks through technical bottlenecks of single energy conversion, poor reliability and large energy loss present in traditional dynamic isotope batteries, and has characteristics of high energy conversion efficiency, good working stability, adjustable output power, strong environmental applicability, and long service life.

The dynamic isotope battery according to embodiments of the present disclosure has the following operating principle: thermal energy generated by the decay of an isotope heat source (i.e., the radioactive source) heats the liquid metal through the fuel cartridge, as a result, the liquid metal expands to form a steady fluid and drives the piezoelectric transduction component to deform and output electric energy, then the liquid metal is cooled by the heat dissipation structure, and finally driven by the electromagnetic pump to return to the chamber to be heated again, so as to achieve the closed circulation.

It should be illustrated that, in the drawings of the present disclosure, the symbol "·" indicates a direction perpendicular to the paper surface and outward, while the symbol "X" indicates a direction perpendicular to the paper surface and inward.

Figure 2:
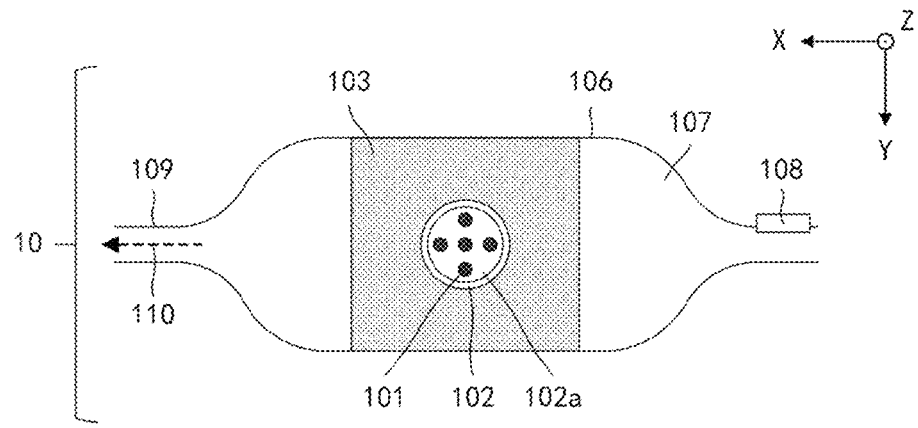
FIG. 2 is a sectional view of a heat source structure in a dynamic isotope battery shown in FIG. 1 along an AB line.
Figure 3:
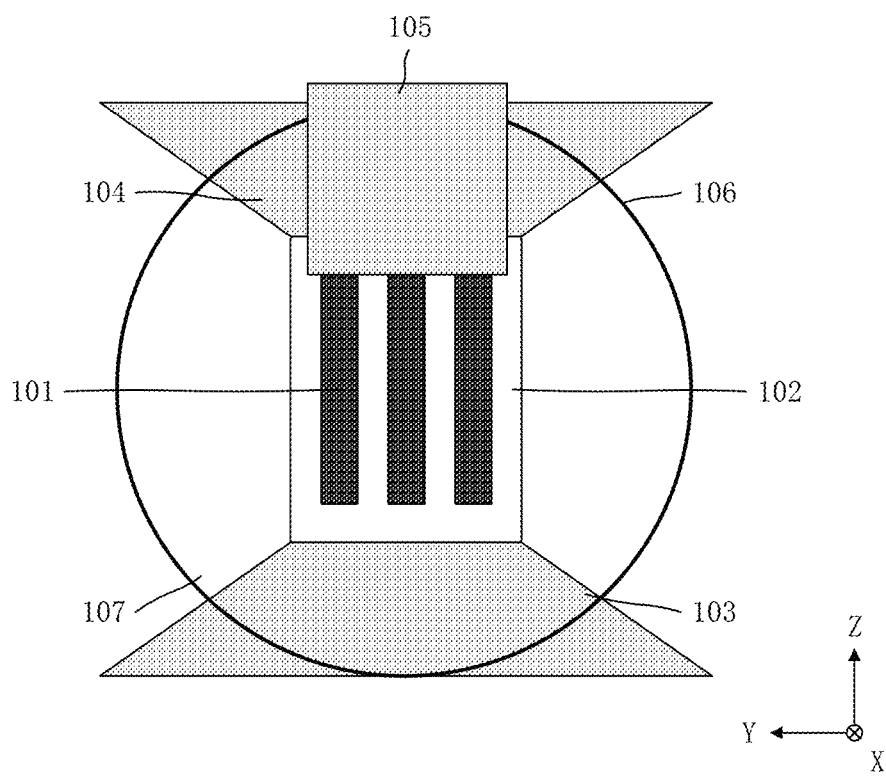
FIG. 3 is a front view of a heat source structure in a dynamic isotope battery according to an embodiment of the present application.

In embodiments of the present disclosure, for convenience of the arrangement and replacement of the radioactive source, referring to FIGS. 1-3, the fuel cartridge 102 may be provided with a first opening at an upper surface thereof, and the housing 106 is provided with a second opening corresponding to the first opening. Therefore, the fuel cartridge 102 may be communicated with outside of the housing 106 through the first opening and the second opening. The first opening and the second opening are sealed by a gasket 105, and the radioactive source 101 is fixed at the gasket. In an embodiment of the present disclosure, the gasket 105 is disposed in the first opening and the second opening to seal the first opening and the second opening, a first end of the radioactive source 101 is disposed at the gasket 105, and a second end of the radioactive source 101 is inserted into the fuel cartridge 102. In an embodiment of the present disclosure, the gasket 105 is detachable. In this way, the radioactive source 101 is replaceable in virtue of the detachable gasket 105, thereby prolonging the service life of the dynamic isotope battery and reducing design costs of the isotope battery. Moreover, the number of the radioactive source may be flexibly adjusted according to actual applications.

For further fixing the radioactive source, in an embodiment of the present disclosure, the gasket 105 is provided with a fixing element 102a by which the radioactive source 101 is fixed to the gasket. In the present disclosure, the fixing element is not limited to specific types. In some embodiments of the present disclosure, the fixing element 102a is a fixed grid, and the radioactive source 101 is fitted in the fixed grid. Therefore, the fixing element 102a is simple in structure and easy to manufacture, and the radioactive source 101 is easy to install and disassemble.

In an embodiment of the present disclosure, in order to prevent the fuel cartridge 102 from shaking and thereby affecting the normal use of the battery during the operation of the battery, the fuel cartridge 102 may be fixed. Referring to FIGS. 1-3 in which FIG. 2 is a sectional view of the dynamic isotope battery shown in FIG. 1 along an AB line, the dynamic isotope battery 1 further includes a first fixing bracket 103 and a second fixing bracket 104, and the fuel cartridge 102 is clamped between the first fixing bracket 103 and the second fixing bracket 104. Specifically, the first fixing bracket 103 is disposed between a lower surface of the fuel cartridge 102 and an inner surface of the housing 106. The second fixing bracket 104 is disposed between the upper surface of the fuel cartridge 102 and the inner surface of the housing 106, and provided with a third opening (not shown in drawings) corresponding to the first and second openings, and the third opening is sealed by the gasket 105. In this way, the working stability and service life of the dynamic isotope battery are improved.

Figure 5:
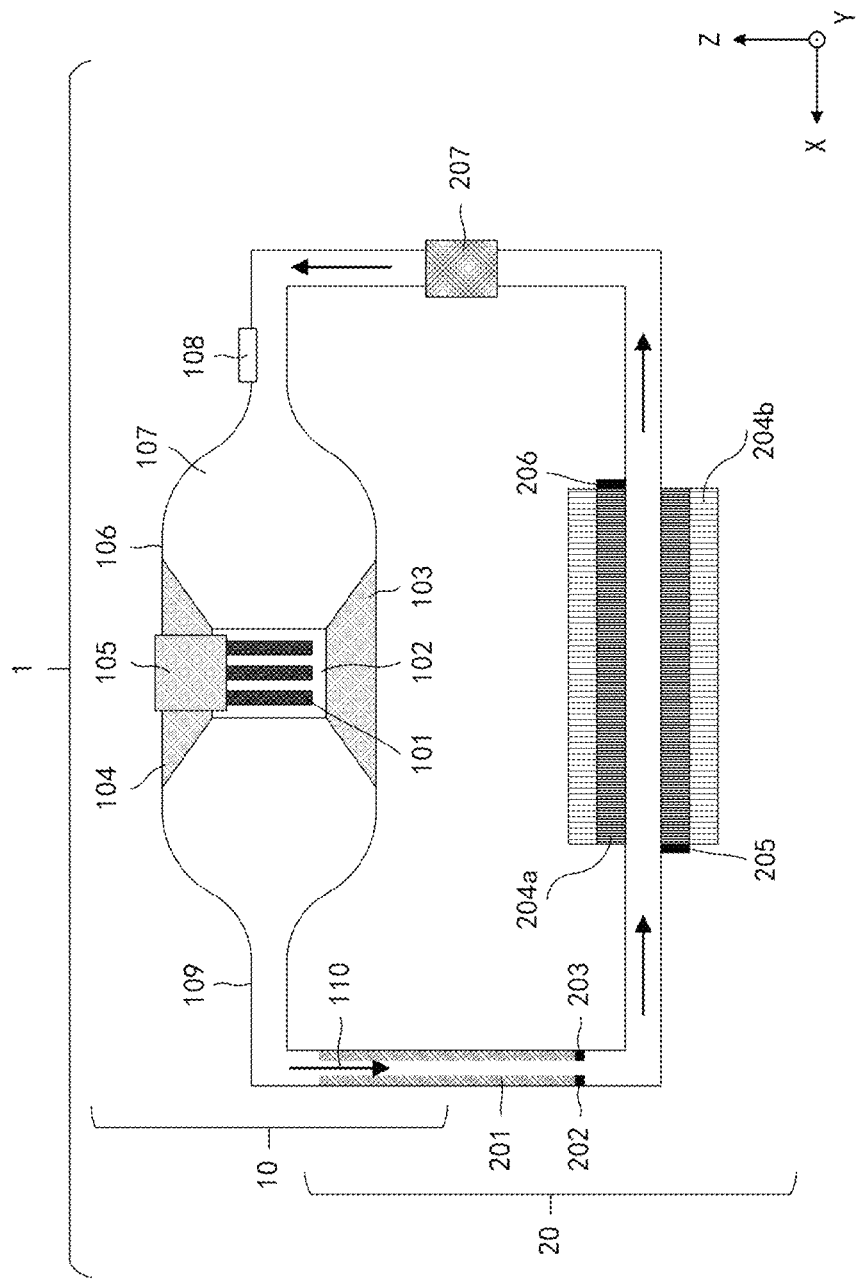
FIG. 5 is a schematic diagram of a dynamic isotope battery according to an embodiment of the present application.

It should be illustrated that, as shown in FIG. 1 and FIG. 5, in some embodiments, a heat source structure 10 of the dynamic isotope battery may include the chamber 107 for accommodating the heat source, the housing 106, the fuel cartridge 102, and the radioactive source 101 contained in the fuel cartridge 102. In some embodiments, the heat source structure 10 may optionally further include the gasket 105, the first fixing bracket 103 and the second fixing bracket 104, etc. In some embodiments, an energy conversion structure 20 of the dynamic isotope battery includes the piezoelectric transduction component 201. In some embodiments, the energy conversion structure 20 may optionally further include a thermoelectric transduction component 204a.

In an embodiment of the present disclosure, the fuel cartridge, the gasket and the fixing element may be made of the same or different materials. In order to improve the safety and stability of the dynamic isotope battery, the fuel cartridge, the gasket, and the fixing element each are made of one or more materials selected from a tantalum-base alloy, a zirconium-base alloy and an iridium-base alloy. In this way, the radioactive source may be ensured to be in a safe and stable working environment, thereby guaranteeing the stability, safety and reliability of the dynamic isotope battery. In addition, those skilled in the art may adjust a geometrical shape, a physical size and the number of the fixing element according to requirements of an output voltage and current in practical applications.

In embodiments of the present disclosure, the housing, the metallic canal, the first fixing bracket and the second fixing bracket each are made of a material selected from one or more of 316 stainless steel, 304 stainless steel and 310 stainless steel. In the present disclosure, there is no restriction on a shape of the housing, which may be flexibly designed by those skilled in the art according to actual requirements. In embodiments of the present disclosure, the housing has a part wider than the metallic canal and two ends communicated with two ends of the metallic canal, respectively. Therefore, the housing is narrowed at the two ends thereof. Specifically, the shape of the housing may be a cylinder or a chamfered cuboid with its middle part being wider than two end parts. The metallic canal has a shape matched with openings at the two ends of the housing. In addition, it will be appreciated that those skilled in the art may determine the number and size of the first fixing bracket and the second fixing bracket, and adjust a geometrical shape and a physical size of the fuel cartridge according to requirements of working environments.

In an embodiment of the present disclosure, in order to improve the shielding effect on radiation and improve the safety of the battery, the housing may be provided with a nano lead plexiglass composite coating on the inner surface thereof. A thickness of the nano lead plexiglass composite coating may be flexibly adjusted according to requirements of working environments. As a result, the dynamic isotope battery has a good radiation shielding property and good safety.

The dynamic isotope battery according to embodiments of the present disclosure expands the selection range of the radioactive source. In some embodiments, the radioactive source is at least one selected from an $\alpha$ radioactive source, a $\beta$ radioactive source, a related spent nuclear fuel, a small modular nuclear heat source and a small modular reactor. In some specific embodiments of the present disclosure, the $\alpha$ radioactive source is at least one selected from $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$_3^{210}$Po, Y$_3^{210}$Po, La$_3^{210}$Po, Ce$_3^{210}$Po, Pr$_3^{210}$Po, Nd$_3^{210}$Po, Sm$_3^{210}$Po, Eu$_3^{210}$Po, Th$_3^{210}$Po, Dy$_3^{210}$Po, Ho$_3^{210}$Po, Er$_3^{210}$Po, Tm$_3^{210}$Po, Yb$_3^{210}$Po, Lu$_3^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel sphere, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$. In some specific embodiments of the present disclosure, the $\beta$ radioactive source is at least one selected from $(C_4H_3^3H_5\text{—})_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{99}$Tc, $^{106}$Ru, $^{137}$Cs, $^{137}$CsCl, $^{144}$Ce, $^{144}$CeO$_2$, $^{147}$Pm, $^{147}$Pm$_2$O$_3$, $^{151}$Sm and $^{226}$Ra.

It should be illustrated that, the term "related spent nuclear fuel" used herein refers to at least one selected from a bitumen-based solid spent nuclear fuel, a concrete-based solid spent nuclear fuel, a glass-based solid spent nuclear fuel and a ceramic-composite solid spent nuclear fuel; the term "small modular nuclear heat source" refers to at least one selected from a general purpose heater source or a lighted weighted radioisotope heater unit; and the term "small modular reactor" refers to at least one of reactors which is dominated by the third generation nuclear reactor technology and combines characteristics of small-scale power generation and modular production. In addition, the radioactive source $(C_4H_3^3H_5\text{—})_n$ refers to a tritiated poly (1-ethylethylene), where n represents a degree of polymerization, which is not limited to a specific value and may be flexibly selected by those skilled in the art according to application fields or specific parameter requirements of the dynamic isotope battery.

According to embodiments of the present disclosure, the activity, loading amount and physical size of the radioactive source may be flexibly adjusted according to requirements of the output voltage and current in practical applications.

In an embodiment of the present disclosure, the liquid metal is at least one selected from a liquid Ga metal, a liquid GaSn alloy, a liquid GaIn alloy, a liquid GaZn alloy, a liquid GaInSn alloy, a liquid GaInZn alloy, a liquid GaInSnZn alloy, a liquid BiInSn alloy and a liquid BiInSnGa alloy. Consequently, the above-described liquid metal, when heated, expands to form a steady fluid, which drives the piezoelectric transduction component to generate electric energy and output the electric energy, thereby ensuring the current stability of the dynamic isotope battery.

Figure 4:
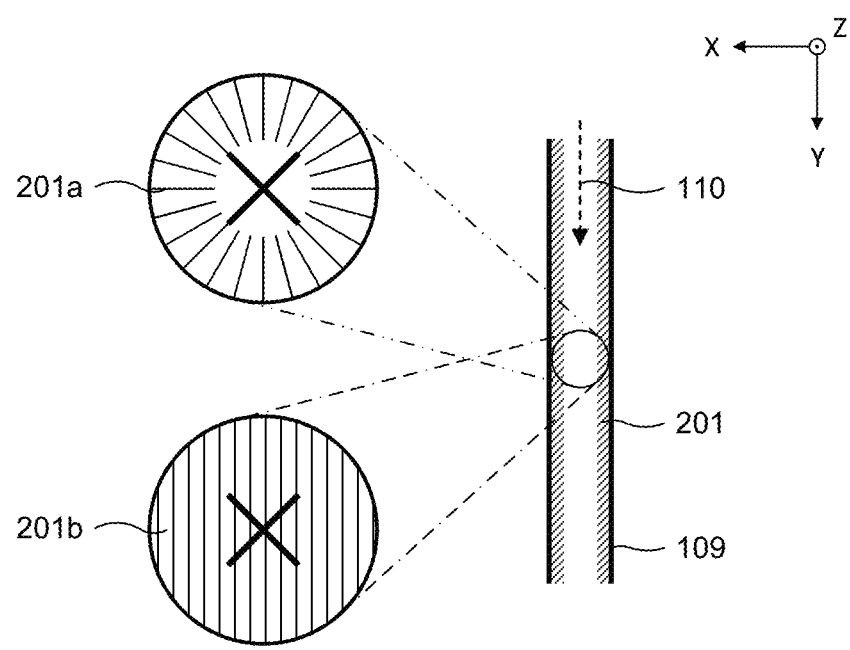
FIG. 4 is a top view of a piezoelectric transduction component in a dynamic isotope battery according to an embodiment of the present disclosure.

According to embodiments of the present disclosure, the piezoelectric transduction component 201 may be a single-side fixed piezoelectric transduction component 201a or a double-side fixed piezoelectric transduction component 201b (referring to FIG. 4), which may be flexibly selected by those skilled in the art according to parameter requirements of the dynamic isotope battery. In some embodiments, the piezoelectric transduction component is made of a material selected from one or more of lead titanate, lead zirconate titanate, lead magnesium niobate, lead zinc niobate, lead scandium tantalate, barium titanate, sodium bismuth titanate, polyvinylidene fluoride and perovskite piezoelectric materials. Therefore, the usage requirement of the piezoelectric transduction component is met, the energy conversion efficiency, reliability and stability of the dynamic isotope battery are improved, and the output power of the battery is ensured to be adjustable.

In some embodiments, the piezoelectric transduction component 201 may be a unimorph piezoelectric transduction component or a bimorph piezoelectric transduction component, which may be selected flexibly according to specific parameter requirements. In addition, the number and combination manners of the piezoelectric transduction components may also be flexibly selected to integrate an energy conversion component, for example, the piezoelectric transduction components may be connected in series, in parallel or in series-parallel.

In some embodiments of the present disclosure, the heat dissipation structure may include at least one selected from a cooling fin, a radiating fin and an annular radiator. The heat dissipation structure is made of a material selected from one or more of graphite, copper and an aluminum-base alloy. In an embodiment, the heat dissipation structure may be disposed at a side of the thermoelectric transduction component away from the metallic canal, thereby reducing the temperature of the liquid metal, increasing a temperature difference between two ends of the thermoelectric transduction component, improving the energy conversion efficiency of the thermoelectric transduction component, as well as improving the energy utilizing rate of the radioactive source.

In an embodiment of the present disclosure, in order to stably fix the electromagnetic pump at the metallic canal, the electromagnetic pump may be selected to be a cylindrical pump. Therefore, the working stability of the dynamic isotope battery may be further improved.

According to embodiments of the present disclosure, in order to further solve the problem of single energy conversion, referring to FIG. 5, the dynamic isotope battery according to embodiments of the present disclosure may further includes a thermoelectric transduction component 204a disposed between the outer surface of the metallic canal 109 and the heat dissipation structure 204b. With the thermoelectric transduction component, electricity generation may be achieved by taking advantage of a temperature difference between the liquid metal and the environment, thereby improving the energy conversion efficiency of the dynamic isotope battery, and solving the technical problem of single energy conversion present in the traditional dynamic isotope battery.

It should be illustrated that, the number and combination manners of the thermoelectric transduction components may be flexibly selected by those skilled in the art to integrate the transduction component according to specific parameter requirements, for example, the thermoelectric transduction components may be connected in series, in parallel or in series-parallel.

Figure 6:
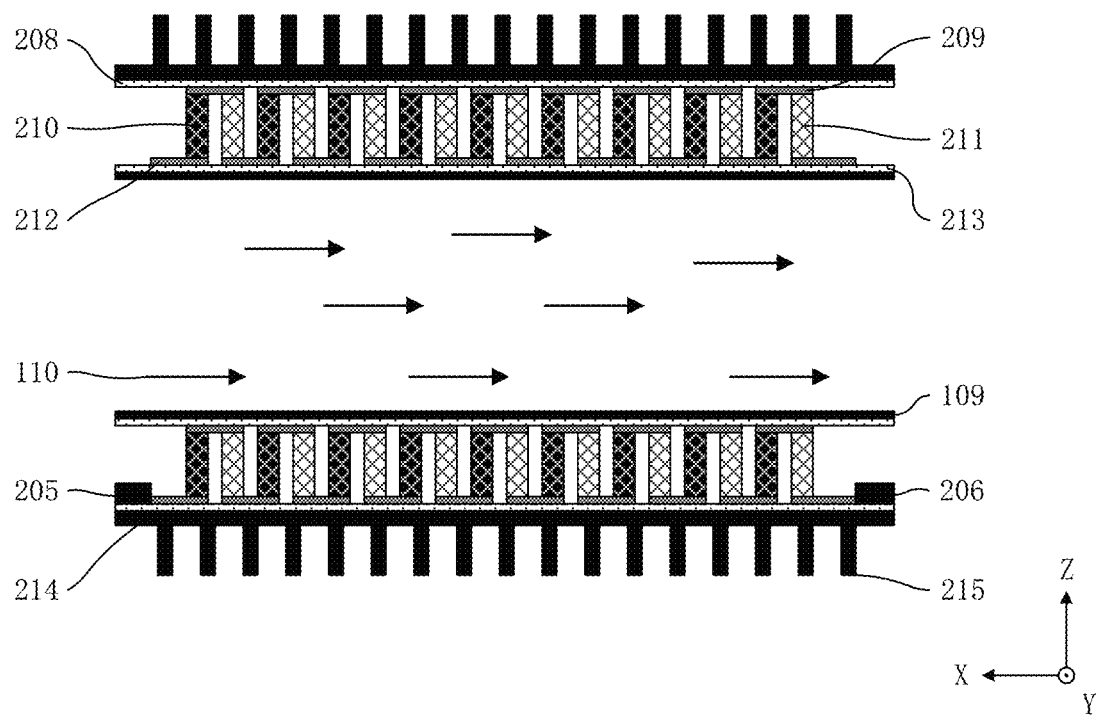
FIG. 6 is a sectional view of a thermoelectric transduction component in a dynamic isotope battery according to an embodiment of the present disclosure.

In an embodiment of the present disclosure, referring to FIG. 6, which shows two non-adjacent thermoelectric groups in a ring structure, the thermoelectric transduction component 204a includes a first insulative and heat conductive substrate 208; a second insulative and heat conductive substrate 213 opposite to the first insulative and heat conductive substrate 208 and disposed on the outer surface of the metallic canal 109; and a plurality of thermoelectric groups distributed in a circumferential direction of the metallic canal 109 and spaced apart each other. Each thermoelectric group extends along the axial direction of the metallic canal and includes a plurality of p-type thermoelectric legs 210 and a plurality of n-type thermoelectric legs 211. The plurality of the p-type thermoelectric legs 210 and the plurality of the n-type thermoelectric legs 211 are alternately arranged and electrically connected in sequence. Each thermoelectric group has one first-end thermoelectric leg and one second-end thermoelectric leg, and two end thermoelectric legs of two adjacent thermoelectric groups at the same end are in different types.

In some embodiments, the first-end thermoelectric leg of a thermoelectric group is electrically connected to the first-end thermoelectric leg of one of two thermoelectric groups both adjacent to said thermoelectric group, and the second-end thermoelectric leg of said thermoelectric group is electrically connected to the second-end thermoelectric leg of the other one of two thermoelectric groups both adjacent to said thermoelectric group. With the plurality of the thermoelectric groups, the temperature difference between the liquid metal and the environment may be converted into the electric energy, thereby achieving the energy conversion effect of the thermoelectric transduction component.

In some embodiments, for each thermoelectric group, the first-end thermoelectric leg of the thermoelectric group is electrically connected to the first-end thermoelectric leg of a thermoelectric group, if present, previous to the thermoelectric group, and the second-end thermoelectric leg of the thermoelectric group is electrically connected to the second-end thermoelectric leg of a thermoelectric group, if present, next to the thermoelectric group. With the plurality of the thermoelectric groups, the temperature difference between the liquid metal and the environment may be converted into the electric energy, thereby achieving the energy conversion effect of the thermoelectric transduction component.

In an embodiment of the present disclosure, referring to FIG. 6, the thermoelectric transduction component 204a further includes a plurality of first electrodes 209 and a plurality of second electrodes 212. The plurality of the first electrodes 209 are disposed between the thermoelectric group and the first insulative and heat conductive substrate 208; and the plurality of the second electrodes 212 are disposed between the thermoelectric group and the second insulative and heat conductive substrate 213.

In some embodiments, one p-type thermoelectric leg 210 and one n-type thermoelectric leg 211 adjacent to and electrically connected with the one p-type thermoelectric leg 210 constitute a thermoelectric pair. The p-type thermoelectric leg 210 and the n-type thermoelectric leg 211 in each thermoelectric pair are electrically connected via the first electrode 209, and the p-type thermoelectric leg 210 in one of two adjacent thermoelectric pairs and the n-type thermoelectric leg 211 in the other of the two adjacent thermoelectric pairs are electrically connected via the second electrode 212. With the plurality of the thermoelectric groups, the temperature difference between the liquid metal and the environment may be converted into the electric energy, thereby achieving the energy conversion effect of the thermoelectric transduction component.

In some embodiments, each thermoelectric leg has a first end and a second end, the first end of an n-type thermoelectric leg is electrically connected to the first end of one of two p-type thermoelectric legs both adjacent to said n-type thermoelectric leg through the first electrode, and the second end of said n-type thermoelectric leg is electrically connected to the second end of the other one of two p-type thermoelectric legs both adjacent to said n-type thermoelectric leg through the second electrode.

In some embodiments of the present disclosure, the p-type thermoelectric leg is made of a material selected from one or more of p-type $Bi_2Te_3$-based material, p-type $Sb_2Se_3$-based material, p-type $Sb_2Te_3$-based material, p-type PbTe-based material, p-type $CoSb_3$-based material, p-type half-Heusler material, p-type $Cu_{1.8}S$-based material and p-type $AgSbTe_2$-based material; and the n-type thermoelectric leg is made of a material selected from one or more of n-type $Bi_2Te_3$-based material, n-type BiSb-based material, n-type $Zn_4Sb_3$-based material, n-type $Mg_3Sb_2$-based material, n-type $Bi_2Se_3$-based material, n-type $Sb_2Se_3$-based material, n-type PbTe-based material, n-type PbS-based material, n-type $CoSb_3$-based material, n-type $Mg_2Si$-based material, n-type $Zn_4Sb_3$-based material, n-type InSb-based material, n-type half-Heusler material, n-type oxide material and n-type $AgSbTe_2$-based material. Therefore, the thermoelectric transduction component has a high energy conversion efficiency, a good stability during the operation, and a long service life.

In some embodiments of the present disclosure, the first electrode and the second electrode each are made of a material selected from one or more of Au, Pd, Pt, Al, Cu, Ni and Ti. Therefore, the first electrode and the second electrode have a good electrical conductivity and a good compatibility with the p-type thermoelectric legs and the n-type thermoelectric legs.

In some embodiments of the present disclosure, in order to increase the temperature difference between the liquid metal and the environment and improve the energy conversion efficiency of the thermoelectric transduction component, the dynamic isotope battery further includes a heat dissipation structure provided at an outer surface of the thermoelectric transduction component 204a. The heat dissipation structure is not limited to a specific structure, and may be flexibly designed by those skilled in the art as required. For example, the heat dissipation structure may be at least one selected from a cooling fin, a radiating fin and an annular radiator. In some embodiments of the present disclosure, referring to FIG. 6, the heat dissipation structure may include an annular radiator 214 provided at the outer surface of the thermoelectric transduction component 204a; and a plurality of radiating fins 215 provided at a side of the annular radiator 214 away from the thermoelectric transduction component 204a and spaced apart each other. Therefore, the heat dissipation structure has a better heat dissipation effect, and maximizes the temperature difference between the liquid metal and the environment, thereby further improving the energy conversion efficiency of the thermoelectric transduction component.

According to embodiments of the present disclosure, a material of the heat dissipation structure is not specifically limited as long as the temperature difference between the liquid metal and the environment can be increased. In some embodiments, the heat dissipation structure is made of a material selected from one or more of graphite, copper and an aluminum-base alloy.

In some embodiments of the present disclosure, in order to realize the power output of the dynamic isotope battery, referring to FIGS. 1, 5 and 6, the piezoelectric transduction component 201 is provided with a first piezoelectric output electrode 202 and a second piezoelectric output electrode 203; and the thermoelectric transduction component 204a is provided with a first thermoelectric output electrode 205 and a second thermoelectric output electrode 206. The first piezoelectric output electrode, the second piezoelectric output electrode, the first thermoelectric output electrode and the second thermoelectric output electrode each are made of one or more of Au, Pd, Pt, Al, Cu, Ni and Ti. As a result, a good electric conductivity is achieved, which is beneficial to the power output of the dynamic isotope battery.

The dynamic isotope battery according to embodiments of the present disclosure will be described in detail below with reference to two specific examples.

Referring to FIG. 1, a structure of a dynamic isotope battery according to an example of the present disclosure is as follows. The dynamic isotope battery includes a housing 106 and a metallic canal 109, and two opposite ends of the housing 106 are communicated with two ends of the metallic canal 109 respectively to form a closed circulation loop. The housing 106 defines a chamber 107 therein for accommodating a heat source and is provided with a non-return valve 108 at an upper part thereof. Through the non-return valve 108, a liquid metal 110 is fed to the metallic canal 109 and thus to the circulation loop. The housing 106 is coated with a nano lead plexiglass composite coating at an inner surface thereof. A first fixing bracket 103 and a second fixing bracket 104 are disposed at the inner surface of the housing 106, and a fuel cartridge 102 is clamped between the first fixing bracket 103 and the second fixing bracket 104. That is, the first fixing bracket 103 is disposed between a lower surface of the fuel cartridge 102 and the inner surface of the housing 106; and the second fixing bracket 104 is disposed between an upper surface of the fuel cartridge 102 and the inner surface of the housing 106. The fuel cartridge 102 is sealed by a gasket 105, and an isotope heat source 101 (a radioactive source) is disposed in the fuel cartridge 102 and fixed at the gasket 105 by a fixing element 102a. In other words, the gasket 105 is provided with the fixing element 102, by which the radioactive source 101 is fixed to the gasket 105). Specifically, the fuel cartridge 102 has a first opening at an upper surface thereof, the housing 106 is provided with a second opening, the second fixing bracket 104 is provided with a third opening, the first opening, the second opening and the third opening correspond to each other in position, and the gasket 105 is disposed in the first to the third openings to seal the fuel cartridge 102, the housing 106 and the second fixing bracket 104. The dynamic isotope battery includes an energy conversion structure 20 which includes a piezoelectric transduction component 201 disposed on an inner surface of the metallic canal 109. The piezoelectric transduction component 201 is provided with a first piezoelectric output electrode 202 and a second piezoelectric output electrode 203 at a bottom thereof to output electric energy. A heat dissipation structure 204b is provided at an outer surface of the metallic canal 109 and spaced apart from the piezoelectric transduction component 201 along an axial direction of the metallic canal 109. The dynamic isotope battery further includes an electromagnetic pump 207 provided at the metallic canal 109 for driving circular flow of the liquid metal.

In this example, the isotope heat source 101 is 238PuO2 ceramic; the liquid metal 110 is a liquid GaInSnZn alloy; the electromagnetic pump 207 is a cylindrical pump; the fuel cartridge 102, the fixing element 102a and the gasket 105 are made of the same material such as the tantalum-base alloy; the piezoelectric transduction component 201 is a single-side fixed piezoelectric transduction component 201a and made of lead magnesium niobate (as known as plumbum magnesium niobate, PMN); the first fixing bracket 103, the second fixing bracket 104, the housing 106 and the metallic canal 109 are made of the same material such as 316 stainless steel; the first piezoelectric output electrode 202 and the second piezoelectric output electrode 203 are made of the same material, each is made of Cu; and the heat radiation fin 204b is a graphite fin. It will be appreciated to those skilled in the art that the above components may also be made of other materials as described hereinbefore. For example, the fuel cartridge 102, the fixing element 102a and the gasket 105 each may also be made of iridium-base alloy or zirconium-base alloy, the same is true for other components, and will not be elaborated herein.

The dynamic isotope battery as described in this example has the following operating principle: the isotope heat source decays to generate thermal energy, which heats the liquid metal through the fuel cartridge, as a result, the liquid metal expands to form a steady fluid, driving the piezoelectric transduction component to deform and output electric energy, and finally, the liquid metal is driven by the electromagnetic pump to return to the chamber to be heated again, so as to achieve the closed circulation.

According to another example of the present disclosure, a dynamic isotope battery is provided. Referring to FIG. 5, the dynamic isotope battery includes a housing 106 and a metallic canal 109, and two opposite ends of the housing 106 are communicated with two ends of the metallic canal 109 respectively to form a closed circulation loop. The housing 106 defines a chamber 107 therein for accommodating a heat source and is provided with a non-return valve 108 at an upper part thereof. Through the non-return valve 108, a liquid metal 110 is fed to the metallic canal 109 and thus to the circulation loop. The housing 106 is coated with a nano lead plexiglass composite coating at an inner surface thereof. A first fixing bracket 103 and a second fixing bracket 104 are disposed at the inner surface of the housing 106, and a fuel cartridge 102 is clamped between the first fixing bracket 103 and the second fixing bracket 104. That is, the first fixing bracket 103 is disposed between a lower surface of the fuel cartridge 102 and the inner surface of the housing 106; and the second fixing bracket 104 is disposed between an upper surface of the fuel cartridge 102 and the inner surface of the housing 106. The fuel cartridge 102 is sealed by a gasket 105, and an isotope heat source 101 (a radioactive source) is disposed in the fuel cartridge 102 and fixed at the gasket 105 by a fixing element 102a. In other words, the gasket 105 is provided with the fixing element 102, by which the radioactive source 101 is fixed to the gasket 105). Specifically, the fuel cartridge 102 has a first opening at an upper surface thereof, the housing 106 is provided with a second opening, the second fixing bracket 104 is provided with a third opening, the first opening, the second opening and the third opening correspond to each other in position, and the gasket 105 is disposed in the first to the third openings to seal the fuel cartridge 102, the housing 106 and the second fixing bracket 104.

The dynamic isotope battery includes an energy conversion structure 20 which includes a piezoelectric transduction component 201 and a thermoelectric transduction component 204a. The piezoelectric transduction component 201 is disposed on an inner surface of the metallic canal 109 and provided with a first piezoelectric output electrode 202 and a second piezoelectric output electrode 203 at a bottom thereof to output electric energy. The thermoelectric transduction component 204a (its specific structure may refer to the related description hereinbefore in combination with FIG. 6, which is incorporated herein and thus will not be elaborated herein) is disposed at an outer surface of the metallic canal 109 and spaced apart from the piezoelectric transduction component 201 along an axial direction of the metallic canal 109. The thermoelectric transduction component 204a is provided with a first thermoelectric output electrode 205 and a second thermoelectric output electrode 206 for outputting electric energy at two ends thereof, respectively. A heat dissipation structure 204b is provided at an outer surface of the thermoelectric transduction component 204a, and includes an annular radiator 214 and a radiating fin 215. The dynamic isotope battery further includes an electromagnetic pump 207 provided at the metallic canal 109 for driving circular flow of the liquid metal 110.

In this example, the isotope heat source 101 is a small modular reactor; the liquid metal 110 is a liquid GaInSn alloy; the electromagnetic pump 207 is a cylindrical pump; the p-type thermoelectric leg 210 is made of a p-type $Bi_2Te_3$-based material, and the n-type thermoelectric legs 211 is made of a n-type $Bi_2Te_3$-based material; the fuel cartridge 102, the fixing element 102a and the gasket 105 are made of the same material such as zirconium-base alloy; the piezoelectric transduction component 201 is a single-side fixed piezoelectric transduction component 201a, and is made of lead magnesium niobate (also known as plumbum magnesium niobate, PMN); the first fixing bracket 103, the second fixing bracket 104, the housing 106 and the metallic canal 109 are made of the same material such as 316 stainless steel; the first piezoelectric output electrode 202, the second piezoelectric output electrode 203, the first thermoelectric output electrode 205, the second thermoelectric output electrode 206, the first electrode 209 and the second electrode 212 are made of the same material such as Au; the first insulative and heat conductive substrate 208 and the second insulative and heat conductive substrate 213 are made of the same material such as aluminium oxide ceramic; and the heat dissipation structure 204b is made of graphite. It will be appreciated to those skilled in the art that the above components each may also be made of other materials as described hereinbefore. For example, the fuel cartridge 102, the fixing element 102a and the gasket 105 may also be made of iridium-base alloy or tantalum-base alloy, the same is true for other components, and will not be elaborated herein.

The dynamic isotope battery as described in this example has the following operating principle: the isotope heat source decays to generate thermal energy, which heats the liquid metal through the fuel cartridge, as a result, the liquid metal expands to form a steady fluid, driving the piezoelectric transduction component to deform and output electric energies, at the same time, the energy generation is achieved by the thermoelectric transduction component taking advantage of the temperature difference between the liquid metal and the environment, and finally, the liquid metal is driven by the electromagnetic pump to return to the chamber to be heated again, so as to achieve the closed circulation.

The dynamic isotope battery according to embodiments of the present application realizes the stable circulation of the liquid metal by using the piezoelectric and optionally thermoelectric transduction components as transduction components and relying on the electromagnetic pump, thereby not only effectively breaking through technical bottlenecks existing in the traditional dynamic isotope battery, for example, difficult to lubricate a high-speed running part, poor system stability affected by an inertia vector of a high-speed rotating part, and poor circulation reliability of inert gas working medium compressed by a one-way pneumatic valve, but also greatly improving the energy conversion efficiency thereof. Moreover, the dynamic isotope battery according to embodiments of the present application has characteristics of high energy conversion efficiency, continuously adjustable output power, strong environmental applicability, good working stability, long service life and easy to implement, etc., and thus is able to work stably for a long time in military and national defense, deep-space, deep-sea and polar explorations, biomedical and electronic industries and other important fields, thereby meeting environmental protection, high efficiency, portability, and universality requirements of the energy. Compared with the related art, the dynamic isotope battery according to embodiments of the present application has at least the following beneficial effects.

First, the dynamic isotope battery according to embodiments of the present disclosure realizes cascading energy conversion by adopting such as the piezoelectric transduction component driven by the liquid metal or thermoelectric transduction component, and achieves stable circulation of the liquid metal relying on the electromagnetic pump, thereby effectively breaking through the technical bottlenecks present in the traditional dynamic isotope battery due to limitations of power generating modes with turbine or heat engines and poor circulation of the inert gas compressed by a one-way pneumatic valve, greatly improving the cycle stability and energy conversion efficiency of the battery, and meeting the low-carbon, environmental protective, efficient integration, economic, and universal requirements of the energy.

Second, the heat source structure adopted in the dynamic isotope battery according to embodiments of the present disclosure is able to load the radioactive source, the related spent nuclear fuel, the small modular nuclear heat source or the small modular reactor, further in combination with the fuel cartridge, the fixing bracket, and the curved housing with the nano lead composite coating, the working safety and environmental adaptability of the dynamic isotope battery are further improved.

Third, the dynamic isotope battery according to embodiments of the present disclosure achieves the closed and reciprocating circulation of the liquid metal in the canal by the electromagnetic pump, which is conducive to adjust the mechanical squeeze and thermal stress between the liquid metal and internal structures of the battery like the heat source structure, the energy conversion component and the canal, thereby not only improving the working reliability of battery, but also expanding output power range of battery, further meeting the needs of different fields.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise", "counterclockwise", "axial direction", "radial direction" and "circumferential direction" should be construed to refer to the orientation as then described or as shown in the drawings under discussion. These relative terms are for convenience and simplification of description, but do not indicate or imply that the device or element referred to must have a particular orientation, and do not require that the present disclosure is constructed or operated in a particular orientation. Thus, these relative terms shall not be construed to limit the present disclosure.

In addition, terms such as "first", "second" and the like are used herein for purposes of description and are not intended to indicate or imply relative importance or significance or to imply the number of indicated technical features. Thus, the feature defined with "first" and "second" may comprise one or more of this feature. In the description of the present disclosure, a phrase of "a plurality of" means two or more than two, unless specified otherwise.

In the present disclosure, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications or interactions of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above", or "on top of" a second feature may include an embodiment in which the first feature is right or obliquely "on", "above", or "on top of" the second feature, or just means that the first feature is at a height higher than that of the second feature; while a first feature "below", "under", or "on bottom of" a second feature may include an embodiment in which the first feature is right or obliquely "below", "under", or "on bottom of" the second feature, or just means that the first feature is at a height lower than that of the second feature.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples. In addition, in the absence of contradiction, those skilled in the art can combine the different embodiments or examples described in this specification, or combine the features of different embodiments or examples.

Although explanatory embodiments have been shown and described, it would be appreciated by those skilled in the art that the above embodiments are explanatory and illustrative, but cannot be construed to limit the present disclosure, and changes, alternatives, and modifications can be made in the embodiments without departing from spirit, principles and scope of the present disclosure.

What is claimed is:

1. A dynamic isotope battery, comprising:
   a metallic canal;
   a housing, defining a chamber for accommodating a heat source and provided with a non-return valve, two opposite ends of the housing being communicated with two ends of the metallic canal respectively to form a closed circulation loop;
   a fuel cartridge fixedly disposed within the housing;
   a radioactive source contained in the fuel cartridge;
   a liquid metal provided in the circulation loop;
   a piezoelectric transduction component disposed on an inner surface of the metallic canal;
   a heat dissipation structure, provided at an outer surface of the metallic canal and spaced apart from the piezoelectric transduction component along an axial direction of the metallic canal; and
   an electromagnetic pump, provided at the metallic canal for driving circular flow of the liquid metal.

2. The dynamic isotope battery according to claim 1, wherein the fuel cartridge has a first opening at an upper surface thereof, the housing has a second opening corresponding to the first opening, the first opening and the second opening are sealed by a gasket, and a first end of the radioactive source is disposed at the gasket.

3. The dynamic isotope battery according to claim 2, wherein the gasket is provided with a fixing element, by which the radioactive source is fixed at the gasket.

4. The dynamic isotope battery according to claim 3, wherein the fuel cartridge, the gasket, and the fixing element each are made of a material selected from one or more of a tantalum-base alloy, a zirconium-base alloy and an iridium-base alloy.

5. The dynamic isotope battery according to claim 2, further comprising:
   a first fixing bracket, disposed between a lower surface of the fuel cartridge and an inner surface of the housing; and
   a second fixing bracket, disposed between the upper surface of the fuel cartridge and the inner surface of the housing, and provided with a third opening corresponding to the first and second openings, and the third opening being sealed by the gasket.

6. The dynamic isotope battery according to claim 5, wherein the housing, the metallic canal, the first fixing bracket and the second fixing bracket each are made of a material selected from one or more of 316 stainless steel, 304 stainless steel and 310 stainless steel.

7. The dynamic isotope battery according to claim 1, further comprising a nano-lead plexiglass composite coating coated on an inner surface of the housing.

8. The dynamic isotope battery according to claim 1, wherein the radioactive source is at least one selected from an α radioactive source, a β radioactive source, a related spent nuclear fuel, a small modular nuclear heat source and a small modular reactor.

9. The dynamic isotope battery according to claim 8, wherein the α radioactive source is at least one selected from $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$_3^{210}$Po, Y$_3^{210}$Po, La$_3^{210}$Po, Ce$^3_{210}$Po, Pr$_3^{210}$Po, Nd$_3^{210}$Po, Sm$_3^{210}$Po, Eu$_3^{210}$Po, Tb$_3^{210}$Po, Dy$_3^{210}$Po, Ho$_3^{210}$Po, Er$_3^{210}$Po, Tm$_3^{210}$Po, Yb$_3^{210}$Po, Lu$_3^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel sphere, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$; and the β radioactive source is at least one selected from (C$_4$H$_3^3$H$_5$—)$_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{99}$Tc, $^{106}$Ru, $^{137}$Cs, $^{137}$CsCl, $^{144}$Ce, $^{144}$CeO$_2$, $^{147}$Pm, $^{147}$Pm$_2$O$_3$, $^{151}$Sm and $^{226}$Ra.

10. The dynamic isotope battery according to claim 1, wherein the liquid metal is at least one selected from a liquid Ga metal, a liquid GaSn alloy, a liquid GaIn alloy, a liquid GaZn alloy, a liquid GaInSn alloy, a liquid GaInZn alloy, a liquid GaInSnZn alloy, a liquid BiInSn alloy and a liquid BiInSnGa alloy.

11. The dynamic isotope battery according to claim 1, wherein the piezoelectric transduction component is a single-side fixed piezoelectric transduction component or a double-side fixed piezoelectric transduction component, and the piezoelectric transduction component is made of a material selected from one or more of lead titanate, lead zirconate titanate, lead magnesium niobate, lead zinc niobate, lead scandium tantalate, barium titanate, sodium bismuth titanate, polyvinylidene fluoride and perovskite piezoelectric materials.

12. The dynamic isotope battery according to claim 1, wherein the heat dissipation structure is made of a material selected from one or more of graphite, copper and an aluminum-base alloy.

13. The dynamic isotope battery according to claim 1, further comprising a thermoelectric transduction component disposed between the outer surface of the metallic canal and the heat dissipation structure.

14. The dynamic isotope battery according to claim 13, wherein the thermoelectric transduction component comprises:
   a first insulative and heat conductive substrate;
   a second insulative and heat conductive substrate, opposite to the first insulative and heat conductive substrate and disposed on the outer surface of the metallic canal; and
   a plurality of thermoelectric groups distributed in a circumferential direction of the metallic canal and spaced apart each other, wherein each thermoelectric group extends along the axial direction of the metallic canal and comprises a plurality of p-type thermoelectric legs and a plurality of n-type thermoelectric legs that are alternately arranged and electrically connected in sequence, wherein each thermoelectric group has one first-end thermoelectric leg and one second-end thermoelectric leg, and two end thermoelectric legs of two adjacent thermoelectric groups at the same end are in different types, the first-end thermoelectric leg of a thermoelectric group is electrically connected to the first-end thermoelectric leg of one of two thermoelectric groups both adjacent to said thermoelectric group, and the second-end thermoelectric leg of said thermoelectric group is electrically connected to the second-end thermoelectric leg of the other one of two thermoelectric groups both adjacent to said thermoelectric group.

15. The dynamic isotope battery according to claim 13, wherein the thermoelectric transduction component comprises:
- a first insulative and heat conductive substrate;
- a second insulative and heat conductive substrate, opposite to the first insulative and heat conductive substrate and disposed on the outer surface of the metallic canal; and
- a plurality of thermoelectric groups distributed in a circumferential direction of the metallic canal and spaced apart each other, wherein each thermoelectric group extends along the axial direction of the metallic canal and comprises a plurality of p-type thermoelectric legs and a plurality of n-type thermoelectric legs that are alternately arranged and electrically connected in sequence,
- wherein each thermoelectric group has one first-end thermoelectric leg and one second-end thermoelectric leg, and two end thermoelectric legs of two adjacent thermoelectric groups at the same end are in different types,
- wherein for each thermoelectric group, the first-end thermoelectric leg of the thermoelectric group is electrically connected to the first-end thermoelectric leg of a thermoelectric group, if present, previous to the thermoelectric group, and the second-end thermoelectric leg of the thermoelectric group is electrically connected to the second-end thermoelectric leg of a thermoelectric group, if present, next to the thermoelectric group.

16. The dynamic isotope battery according to claim 14, wherein the thermoelectric transduction component further comprises:
- a plurality of first electrodes disposed between the thermoelectric group and the first insulative and heat conductive substrate; and
- a plurality of second electrodes disposed between the thermoelectric group and the second insulative and heat conductive substrate,
- wherein one p-type thermoelectric leg and one n-type thermoelectric leg adjacent to and electrically connected with the one p-type thermoelectric leg constitute a thermoelectric pair, the p-type thermoelectric leg and the n-type thermoelectric leg in each thermoelectric pair are electrically connected via the first electrode, and the p-type thermoelectric leg in one of two adjacent thermoelectric pairs and the n-type thermoelectric leg in the other of the two adjacent thermoelectric pairs are electrically connected via the second electrode.

17. The dynamic isotope battery according to claim 15, wherein the thermoelectric transduction component further comprises:
- a plurality of first electrodes disposed between the thermoelectric group and the first insulative and heat conductive substrate; and
- a plurality of second electrodes disposed between the thermoelectric group and the second insulative and heat conductive substrate,
- wherein each thermoelectric leg has a first end and a second end,
- the first end of an n-type thermoelectric leg is electrically connected to the first end of one of two p-type thermoelectric legs both adjacent to said n-type thermoelectric leg through the first electrode, and
- the second end of said n-type thermoelectric leg is electrically connected to the second end of the other one of two p-type thermoelectric legs both adjacent to said n-type thermoelectric leg through the second electrode.

18. The dynamic isotope battery according to claim 14, wherein the p-type thermoelectric leg is made of a material selected from one or more of p-type $Bi_2Te_3$-based material, p-type $Sb_2Se_3$-based material, p-type $Sb_2Te_3$-based material, p-type PbTe-based material, p-type $CoSb_3$-based material, p-type half-Heusler material, p-type $Cu_{1.8}S$-based material and p-type $AgSbTe_2$-based material, and
- the n-type thermoelectric leg is made of a material selected from one or more of n-type $Bi_2Te_3$-based material, n-type BiSb-based material, n-type $Zn_4Sb_3$-based material, n-type $Mg_3Sb_2$-based material, n-type $Bi_2Se_3$-based material, n-type $Sb_2Se_3$-based material, n-type PbTe-based material, n-type PbS-based material, n-type $CoSb_3$-based material, n-type $Mg_2Si$-based material, n-type $Zn_4Sb_3$-based material, n-type InSb-based material, n-type half-Heusler material, n-type oxide material and n-type $AgSbTe_2$-based material.

19. The dynamic isotope battery according to claim 13, wherein the piezoelectric transduction component is provided with a first piezoelectric output electrode and a second piezoelectric output electrode, the thermoelectric transduction component is provided with a first thermoelectric output electrode and a second thermoelectric output electrode, and the first piezoelectric output electrode, the second piezoelectric output electrode, the first thermoelectric output electrode and the second thermoelectric output electrode each are made of one or more of Au, Pd, Pt, Al, Cu, Ni and Ti.

20. The dynamic isotope battery according to claim 1, wherein the electromagnetic pump is a cylindrical pump.

* * * * *